United States Patent [19]

Ishihara et al.

[11] Patent Number: 4,824,697
[45] Date of Patent: Apr. 25, 1989

[54] METHOD FOR FORMING A MULTI-LAYER DEPOSITED FILM

[75] Inventors: Shunichi Ishihara, Ebina; Masaaki Hirooka, Toride; Junichi Hanna; Isamu Shimizu, both of Yokohama, all of Japan

[73] Assignee: Canon Kabushiki Kaisha, Tokyo, Japan

[21] Appl. No.: 2,217

[22] Filed: Jan. 12, 1987

[30] Foreign Application Priority Data

Jan. 14, 1986 [JP] Japan ................................ 61-4364

[51] Int. Cl.⁴ ............................................. C23C 16/22
[52] U.S. Cl. ................................ 427/255.2; 427/255; 427/255.7; 437/225
[58] Field of Search ............... 427/85, 86, 248.1, 255, 427/255.1, 255.2, 255.3, 255.7, 87, 39; 428/446, 448, 938, 689; 437/2, 101, 225; 430/128

[56] References Cited

U.S. PATENT DOCUMENTS

| 4,217,374 | 8/1980 | Ovshinsky et al. | 427/86 |
| 4,226,898 | 10/1980 | Ovshinsky et al. | 427/86 |
| 4,504,518 | 3/1985 | Ovshinsky et al. | 427/85 |
| 4,522,663 | 6/1985 | Ovshinsky et al. | 427/86 |
| 4,523,544 | 6/1985 | Harada et al. | 427/39 |
| 4,568,626 | 2/1986 | Ogawa | 427/39 |
| 4,637,895 | 1/1987 | Ovshinsky et al. | 427/39 |
| 4,657,777 | 4/1987 | Hirooka et al. | 427/39 |
| 4,664,937 | 5/1987 | Ovshinsky et al. | 427/86 |

FOREIGN PATENT DOCUMENTS

2148328  5/1985  United Kingdom ............ 427/248.1

Primary Examiner—Sadie Childs
Attorney, Agent, or Firm—Fitzpatrick, Cella, Harper & Scinto

[57] ABSTRACT

A method for forming a deposited film by introducing the active species (A) formed by decomposition of a subjective starting material gas (A) which is the major flow rate component and the active species (B) formed by decomposition of an objective starting material gas (B) which is the minor flow rate component and the activated species (C) formed from a compound (C) separately from each other into a film forming space for formation of a deposited film on a substrate and permitting said active species (A) and active species (B) to chemically react with said activated species (C) to thereby form a deposited film on the substrate comprises forming a multi-layer structure film by varying the amount of said active species (B) introduced into the film forming space.

6 Claims, 2 Drawing Sheets

METHOD FOR FORMING A MULTI-LAYER DEPOSITED FILM

BACKGROUND OF THE INVENTION

1. Field of the Invention

This invention relates to a method for preparation of a functional film, particularly a multi-layer structure film which is useful for uses in electronic devices such as semiconductor devices, photosensitive devices for electrophotography, optical input sensor devices for optical image inputting devices, etc.

2. Related Background Art

Devices by use of amorphous or polycrystalline deposited films of multi-layer structures such as semiconductor films, insulating films, photoconductive film, magnetic films or metal films can be expected to have physical characteristics or uses not desired for deposited films of single layer structure and therefore have been studied aggressively in recent years. Particularly from the standpoint of large area devices, multi-layer structure films having two or more kinds of amorphous layers laminated are attracting interest.

For example, investigations have been made to prepare multi-layer structure films having amorphous silicon (a-Si) layer and amorphous silicon carbide (a-SiC) layer, or amorphous silicon layer and amorphous silicon germanium (a-SiGe) layer laminated alternately according to the chemical vapor deposition method such as the plasma CVD method or the optical CVD method, and they are contemplated to be applied for solar battery or other devices.

Particularly, formation of a deposited film according to the plasma CVD method, while there is involved the problem such that its reaction mechanism has not a few ambiguous points, is now accepted as the best method in view of productivity and characteristics of the film and has been widely applied for production of solar battery, electrophotographic photosensitive member, etc. However, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). By use of a combination of such a large number of parameters, the plasma may sometimes become unstable state, whereby marked deleterious influences may be exerted frequently on the deposited film formed.

Particularly, when forming a multi-layer structure film according to the plasma CVD method, it is necessary to control discharging or gas introduction every time when the kind of the layer is changed.

However, if the amount of the gas introduced is changed to a great extent, the pressure within the reaction space will be changed, whereby the state of discharging becomes unstable to affect badly the structure and the characteristics of the film. Accordingly, if a multi-layer structure is formed only by controlling the amount of the gas introduced with discharging being kept on as such as practiced in the prior art, it is difficult to adjust the conditions so that films with good characteristics may be constantly obtained.

On the other hand, the method in which deposited films are formed by controlling discharging, namely exchanging the gases with discharging being turned off and turned on again after the pressure has reached equilibrium, will take an extremely long time to be disadvantageously poor in productivity. Also, in plasma discharging, discharging is not generally stabilized immediately after discharging is turned on, whereby multi-layer films are obtained which have interfaces of bad characteristics.

For example, when an a-SiGe layer with an optical band gap of 1.5 eV is formed by glow discharging decomposition of $SiH_4$ gas and $GeH_4$ gas, the quantity ratio of $SiH_4$ and $GeH_4$ is made generally 2:1. Accordingly, if the flow rate of $GeH_4$ is controlled for the purpose of preparing a multi-layer structure film of a-SiH layer and a-SiGe:H layer, the pressure within the film forming space receives fluctuation of about 30%. For this reason, the discharging state will change greatly, whereby it is difficult to prepare a multi-layer structure film with good characteristics.

SUMMARY OF THE INVENTION

An object of the present invention is to provide a method for forming a multi-layer structure which is excellent in productivity and bulk productivity and by which a film having high quality as well as excellent physical characteristics such as electrical, optical and semiconductor characteristics can be easily obtained.

Still another object of the present invention is to provide a method for forming a deposited film by introducing the active species (A) formed by decomposition of a subjective starting gas (A) which is the major flow rate component and the activated species (B) formed by decomposition of an objective starting gas (B) which is the minor flow rate component and the activated species (C) formed from a compound (C) separately from each other into a film forming space for formation of a deposited film on a substrate and permitting said active species (A) and active species (B) to chemically react with said activated species (C) to thereby form a deposited film on the substrate, which comprises forming multi-layer structure film by varying introduction amount of said active species (B) into the film forming space.

DESCRIPTION OF THE PREFERRED EMBODIMENTS

The method of the present invention is a method for forming a deposited film by introducing the active species (A) formed by decomposition of a subjective starting gas (A) which is the major flow rate component and the active species (B) formed by decomposition of an objective starting gas (B) which is the minor flow rate component and the activated species (C) formed from a compound (C) separately from each other into a film forming space for formation of a deposited film on a substrate and permitting said active species (A) and active species (B) to chemically react with said activated species (C) to thereby form a deposited film on the substrate, which comprises forming a multi-layer structure film by varying the amount of said active species (B) introduced into the film forming space.

In the method of the present invention, since no plasma is excited in the film forming space for formation of a deposited film, the deposited film will not be badly affected by etching action or otherwise, for example, abnormal discharging action, etc.

One point of difference of the method of the present invention from the CVD method of the prior art resides in use of active species activated previously in a space different from the film forming space (hereinafter called activation space). By doing so, the film forming speed can be dramatically accelerated as compared with the CVD method of the prior art and, in addition, the substrate temperature during formation of the deposited film can be made further lower, whereby deposited films of stable film quality can be provided commercially in a large amount and at low cost.

In the present invention, the above-mentioned active species refers to those having the action of promoting formation of a deposited film by causing chemical interaction with the above deposited film or the excited decomposed product thereof to thereby, for example, impart energy or effect chemical reaction. Accordingly, the active species may contain a constituent element which will become the constituent element constituting the deposited film to be formed or may not contain such constituent element.

In the present invention, the active species (A) from the activation space (A) and the active species (B) from the activation space (B) to be introduced into the film formation space may be selected as desired from those having its life of 0.1 sec. or longer, more preferably 1 sec. or longer, optimally 10 sec. or longer, with viewpoint of productivity and easiness in handling.

The compound for forming the activated species (C) introduced into the activation space (C) to be used in the present invention may preferably be already gaseous before introduction into the activation space (C) or be made gaseous before introduction. For example, when a liquid compound is used, a suitable gasifying device may be connected to the source for supplying the compound and the compound can be gasified before introduction into the activation space (C).

According to the method for formation of a deposited film of the present invention, a multi-layer structure film constituted of two or more kinds of layers such as a multi-layer film having two kinds of layers with different physical properties laminated alternately, etc. can be prepared easily and rapidly. Also, the multi-layer structure film can be prepared with each layer being made to have an extremely thin thickness of, for example, 10 Å to 200 Å.

The amount (b) of the objective starting material gas (B) which is the minor flow rate component relative to the amount (a) of the subjective starting gas (A) which is the major flow rate component may desirably be made ½ or less, more preferably 1/10 or less.

The subjective starting material gas (A) for forming the active species (A) can be constituted of a gas comprising, for example, an element contained in both of the two layers having different physical properties constituting the multi-layer structure film, and can be constituted of gas which must be introduced in extremely greater amount as compared with the objective starting material gas (B) because of remarkably smaller reactivity as compared with the objective starting material gas (B). On the other hand, the objective starting material gas (B) for forming the active species (B) can be constituted, for example, of a gas comprising, for example, an element contained only in one of the two layers having different physical properties forming the multi-layer structure film, and can be formed of a gas which may be introduced in smaller amount than the subjective starting material gas (A) because of remarkably greater reactivity as compared with the subjective starting material gas (A).

When a multi-layer structure film is to be prepared with such two kinds of gases, when a film containing the elements of "A" and "B" is formed, even if the subjective starting material gas (A) may be employed in a large amount and the objective starting material gas (B) in small amount, as the result of the chemical reaction of these active species and the active species (C), a film comprising elements of "A" and "B" with substantially equal elemental ratio can be obtained. Next, in order to form a film consisting only of the element "A", introduction of the active species (B) formed by the objective starting material gas (B) into the film forming space may be stopped, and the pressure change in the reaction chamber is very small.

Specifically, to consider about the case of preparing a multi-layer structure film containing primarily Si element such as a multi-layer structure film of a-Si and a-SiGe or a multi-layer structure film of a-Si and a-SiC, the subjective starting material gas (A) may include silicon compounds such as $SiF_4$, $SiCl_4$, $SiF_2Cl_2$, etc. On the other hand, the objective starting material gas (B) may include germanium compounds such as $GeF_4$, etc. and carbon compounds such as $CF_4$, $C_2F_6$, $CCl_4$, etc.

For example, when an a-SiGe film is prepared from $SiF_4$ and $GeF_4$, they are permitted to flow at a ratio of $SiF_4$ and $GeF_4$, which may generally differ depending on the amount of physical properties demanded for the film, usually 10:1 or less, desirably 100:1 or less.

In the present invention, as the method for forming respectively the active species (A), (B) and (C) in the activation spaces (A), (B) and (C), activation energy, including electrical energy such as microwave, RF, low frequency, DC, etc., heat energy such as obtained by heater heating, IR-ray heating, etc. or optical energy, may be employed in consideration of respective conditions and devices.

In the present invention, the ratio of the total amount of the active species (A) and (B) to the amount of the active species (C) in the film forming space may be determined suitably as desired depending on the deposition conditions, the kinds of the active species, etc., but preferably 10:1 to 1:10 (introduced flow rate ratio), more preferably 8:2 to 4:6.

In the present invention, as the starting material gas for formation of the active species (C), hydrogen gas, hydrogenated silicon compounds, etc. may be employed. As an example of hydrogenated silicon compounds, chain and cyclic silane compounds, chain and cyclic silane compounds of which a part or all of hydrogen atoms are substituted with halogen atoms may be preferred.

Specifically, for example, there may be included straight chain silane compounds represented by $Si_pH_{2p+2}$ (p is an integer of 1 or more, preferably 1 to 14, more preferably 1 to 10) such as $SiH_4$, $Si_2H_6$, $Si_3H_8$, $Si_4H_{10}$, $Si_5H_{12}$, $Si_6H_{14}$ and the like; branched chain silane compounds represented by $Si_pH_{2p+2}$ (p has the same meaning as above) such as $SiH_3SiH(SiH_3)SiH_3$, $SiH_3SiH(SiH_3)Si_3H_7$, $Si_2SiH_5Si_2H_5$ and the like; straight or branched chain silane compounds of which a part or all of hydrogen atoms are substituted with halogen atoms; cyclic silane compounds represented by $Si_qH_{2q}$ (q is an integer of 3 or more, preferably 3 to 6 such as $Si_3H_6$, $Si_4H_8$, $Si_5H_{10}$, $Si_6H_{12}$; cyclic silane compounds of which a part or all of hydrogen atoms are substituted with other cyclic silanyl groups and/or chain silanyl groups. Examples of the silane compounds as exemplified above of which a part or all of hydrogen atoms are substituted with halogen atoms may include halo-substituted chain or cyclic silane compounds represented by $Si_rH_sX_t$ (wherein X is halogen atom, r is an integer of 1 or more, preferably 1 to 10, more preferably 3 to 7, $s+t=2r+2$ or $2r$) such as $SiH_3F$, $SiH_3Cl$, $SiH_3Br$, $SiH_3I$. These compounds may be used either singly or in combination of two or more compounds.

The multi-layer structure deposited film formed by the method of the present invention can be subjected to doping with an impurity element during or after film formation. Doping may be effected in either one to all of the constituent layers of the multi-layer structure film. The impurity element to be used may include, as the p-type impurity, the elements of the group IIIA of the periodic table such as B, Al, Ga, In, Tl, etc. as preferable ones, as the n-type impurity, the elements of the group VA of the periodic table such as P, As, Sb, Bi, etc. as preferable ones. Particularly, B, Ga, P and Sb are most preferred. The amount of the impurity used for doping may be determined suitably depending on the desired electrical and optical characteristics.

As the compound containing such impurity element as the component, it is preferable to select a compound which is gaseous under normal temperature and pressure, or at least gaseous under the activation conditions and readily gasifiable by a suitable gasifying device. Examples of such compounds may include $PH_3$, $P_2H_4$, $PH_3$, $PH_5$, $PCl_3$, $AsH_3$, $AsF_3$, $AsF_5$, $AsCl_3$, $SbH_3$, $SbF_5$, $SiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. The compounds containing impurity element may be used either singly or as a combination of two or more compounds. The substance for introducing an impurity of a halogen compound may be introduced together with the respective substances for forming the active species (A) and (B) into the activation space (A) and/or the activation space (B) to be activated, and a substance for introduction of impurity of a hydrogen compound may be introduced together with the compound for forming the active species (C) into the activation space (C) to be activated, or may be alternatively activated in a third activation space (D) different from the activation spaces (A), (B) and the activation space (C). The substance for introduction of impurity can be employed by selecting suitable the activation energy as described above. The active species (PN) formed by activation of the substance for introduction of impurity may be previously mixed with the active species (A), (B) or the active species (C) before introduction into the film forming space or introduced independently thereinto.

Next, the present invention is to be described by referring to a typical example of an image forming member for electrophotography formed according to the method of the present invention.

Figure 2:
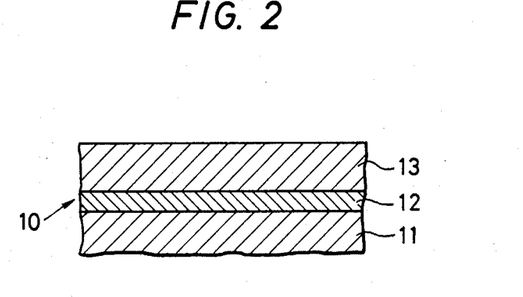
FIG. 2 illustrates schematically a constitutional example of the image forming member for electrophotography prepared by use of the method of the present invention.

FIG. 2 illustrates schematically a constitutional example of a typical photoconductive member obtained by the present invention.

The photoconductive member 10 shown in FIG. 2 is applicable as an image forming member for electrophotography, having a layer constitution consisting of an intermediate layer 12 optionally provided and a photosensitive layer 13 provided on a support 11 for a photoconductive member.

In preparing the photoconductive member 10, the intermediate layer 12 and/or the photosensitive layer 13 can be prepared according to the method of the present invention. Further, when the photoconductive member 10 has a protective layer provided for the purpose of protecting chemically and physically the surface of the photosensitive layer 13 or a lower barrier layer and/or an upper barrier layer provided for the purpose of improving dielectric strength, these layers can be also formed according to the method of the present invention.

The support 11 may be either electroconductive or electrically insulating. As the electroconductive substrate, there may be mentioned metals such as NiCr, stainless steel, Al, Cr, Mo, Au, Ir, Nb, Ta, V, Ti, Pt, Pd etc. or alloys thereof.

As insulating substrates, there may be conventionally used films or sheets of synthetic resigns, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these electrically insulating support is preferably subjected to treatment for imparting electroconductivity, and it is desirable to provide other layers on the surface side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) etc. thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby imparting electroconductivity to the surface. The substrate may be shaped in any form such as cylinders, belt, plates or others, and its form may be determined as desired. For example, if the photoconductive member 10 shown in FIG. 2 is used as the image forming member for electrophotography, it should desirably made into an endless belt or cylindrical shape in the case of continuous high speed copying.

The intermediate layer 12 has the function of, for example, impeding effectively the inflow of the carriers from the side of the support 11 into the photosensitive layer 13 and permitting easily passage of the photocarriers generated in the photosensitive layer 13 by irradiation of an electromagnetic wave and migrated toward the side of the support 11 from the side of the photosensitive layer 13 toward the side of the support 11.

The intermediate layer 12 is constituted of a multi-layer of, for example, an amorphous material such as amorphous silicon germanium containing constituent atoms of hydrogen (H), halogen (X), etc. in a matrix of silicon (Si), if desired, and a constituent element of the objective gas such as germanium (hereinafter written as "A-SiGe(H, X)" and an amorphous material containing optionally hydrogen (H) and/or halogen (X) in a matrix of silicon (Si) (hereinafter written as "A-Si(H, X)"), and also contains a p-type impurity such as B, etc. or a n- type impurity such as P, etc. as a substance for controlling electroconductivity.

In the present invention, the content of the substance for controlling conductivity such as B, P, etc. contained in the intermediate layer 12 may be 10 preferably 0.001 to $5 \times 10^4$ atomic ppm, more preferably 0.5 to $1 \times 10^4$ atomic ppm, most preferably 1 to $5 \times 10$ atomic ppm.

When the intermediate layer 12 is similar to or the same as the photosensitive layer 13 in the constituents, the photosensitive layer 13 can be formed continuously following formation of the intermediate layer 12. In that case, as the starting material for formation of the intermediate layer, by controlling the flows of the active species (A) formed in the activation space (A) and the active species (B) formed in the activation space (B) to introduce them respectively separately from the active species (C) formed from a gaseous hydrogenated silicon, etc., into the film formation space where the support 11 is provided, the chemical reaction may be caused to form the intermediate layer 12 of a multi-layer structure on the support 11.

The compound containing silicon and a halogen to be introduced into the activation space (A) to form the active species (A) during formation of the intermediate layer 12 should desirably be a compound capable of forming readily active species such as $SiF_2^*$ by the action of the activation energy as described above selected from the compounds as mentioned above.

The intermediate layer 12 may have a layer thickness preferably of 30 Å to 10 $\mu$, more preferably 40 Å to 8 $\mu$, most preferably 50 Å to 5 $\mu$.

The photosensitive layer 13 may be constituted of multi-layers of, for example, amorphous silicon A-Si(H, X) containing constituent atoms of hydrogen, halogen, etc. in a matrix of the constituent element of the subjective gas, if desired, namely silicon atoms and amorphous silicon germanium A-SiGe(H, X) containing hydrogen and halogen as the constituent atoms in a matrix of silicon and the constituent element of the objective gas such as germanium, and has both functions of the charge generation function to generate photocarriers by irradiation of laser beam and the charge transport function to transport the charges.

The photosensitive layer 13 may have a layer thickness preferably of 1 to 100 $\mu$, more preferably 1 to 80 $\mu$, most preferably 2 to 50 $\mu$.

The photosensitive layer 13 may be made to have, for example, a multi-layer structure of non-doped A-Si(H, X) and A-SiGe(H, X), but, if desired, a substance for controlling conductive characteristics of the polarity (e.g. n-type) different from the polarity of the substance for controlling conductive characteristics contained in the intermediate layer 12 may be contained therein. Alternatively, when the substance contained in the intermediate layer is practically much in amount, the substance for controlling conductive characteristics of the same polarity may be contained in the photosensitive layer in an amount by far smaller than that in the intermediate layer.

Also, in the case of formation of the photosensitive layer 13, if it is practiced according to the method of the present invention, similarly as in the case of the intermediate layer 12, a compound containing silicon and halogen is introduced into the activation space (A) and the active species (A) is formed by decomposing the compound under high temperature of by excitation by the action of discharging energy or photoenergy, and said active species (A) is introduced into the film forming space.

Into the activation space (B) is introduced the objective starting material gas, for example, a compound containing germanium and halogen, and similarly as the active species (A), the active species (B) is formed by excitation by the action of energy externally applied, and said active species (B) is introduced into the film forming space with its flow rate being intermittently controlled.

Also, separately gaseous hydrogen or a hydrogenated silicon compound is introduced into the activation space (C) and activated by use of the above-mentioned activation energy to form the active species (C), etc., and said active species (C) is introduced into the film forming space. The active species (A) and (B), and the active species (C) thus introduced into the film forming space undergo chemical reaction to form an intermediate layer 12 on the support 11.

Figure 3:
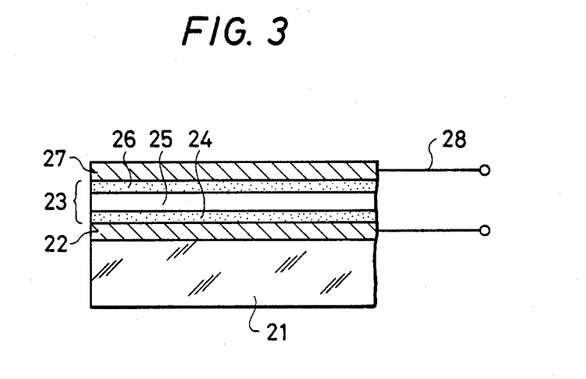
FIG. 3 illustrates schematically a constitutional example of the PIN type diode prepared by use of the method of the present invention.

FIG. 3 illustrates schematically a typical example of the PIN type diode device utilizing the multilayer deposited film of a layer of an amorphous material containing silicon and germanium optionally with hydrogen and/or halogen doped with an impurity element (hereinafter written as "A-SiGe(H, X)") and A-Si layer prepared by practicing the method of the present invention.

In FIG. 3, 21 is a substrate, 22 and 27 are thin film electrodes, and 23 is a semiconductor film consisting of a n-type semiconductor layer 24, an i-type semiconductor layer 25 and a p-type semiconductor layer 26. 28 is a conductive wire. As the substrate 21, a semiconducting, preferably electrically insulating material may be employed.

These semiconductor layers are constituted of multi-layers of A-Si(H, X), A-SiGe(H, X), and the method of the present invention can be applied for preparation of any one of the layers.

Semiconductive substrates may be, for example, semiconductors such as Si, Ge, etc. Thin film electrodes 22, 27 may be obtained by providing thin films such as NiCr, Al, Cr, Mo, Au, Ir, Nb, Ta, V, Ti, Pt, Pd, $In_2O_3$, $SnO_2$, ITO ($In_2O_3 + SnO_2$), etc. by treatment such as vacuum vapor deposition, electron beam vapor deposition, sputtering, etc. on the substrate 21. The layer thickness of the electrodes 22, 27 may preferably be 30 to $5 \times 10^4$ Å, more preferably 100 to $5 \times 10^3$ Å.

Making the film constituting the semiconductor layer of A-Si(H, X) n-type or p-type as desired may be conducted by doping of a n-type impurity or a p-type impurity of the impurity elements or both types impurities in the layer to be formed during layer formation while controlling dits amount. Also, for the p-type or n-type layer, a-SiGe layer, a-SiC layer or a multi-layer structure film of these layers and a-Si layer can be used.

In the case of a multi-layer structure film, doping may be effected in either one of the multiple layers or both layers.

Making the film constituting the semiconductor layer of A-SiGe(H, X) n-type or p-type as desired may be conducted by doping of a n-type impurity or a p-type impurity of the impurity elements or both types impurities in the layer to be formed during layer formation while controlling its amount.

For formation of n-type, i-type and p-type multi-layer structure films, according to the method of the present invention, the subjective starting gas (A), for example, a compound containing silicon and halogen is introduced into the activation space (A) and decomposed by the action of an activation energy to form the active species (A) of, for example, SiF$_2$*, which are introduced into the film forming space. On the other hand, into the activation space (B) is introduced the objective starting gas (B), for example, a compound containing germanium or carbon and a halogen and decomposed by the action of an activation energy to form active species (B) such as GeF$_2$*, CF$_2$*, etc. which are introduced into the film forming space while being controlled intermittently.

Hydrogen and/or hydrogenated silicon compound gas, etc. is introduced into the activation (C) and excited and decomposed by an activation energy to form the active species (C). The active species (A), (B) and the active species (C) are introduced into the film forming space in which the support 11 is placed and undergo chemical reaction therein to form a desired multi-layer deposited film on the support 11. The layer thickness of the n-type and p-type semiconductor layer may preferably be within the range from 20 to $10^4$ Å, more preferably from 100 to 2000 Å.

On the other hand, the layer thickness of the i-type semiconductor layer may preferably be 500 to $10^4$ Å, more preferably 1000 to 10000 Å.

The PIN type diode device shown in FIG. 3 is not necessarily required that all of the layers of p, i and n should be prepared according to the method of the present invention, but the present invention can be practiced by preparing at least one layer of p, i and n according to the method of the present invention.

The present invention is described by referring to the following Examples.

EXAMPLE 1

Figure 1:
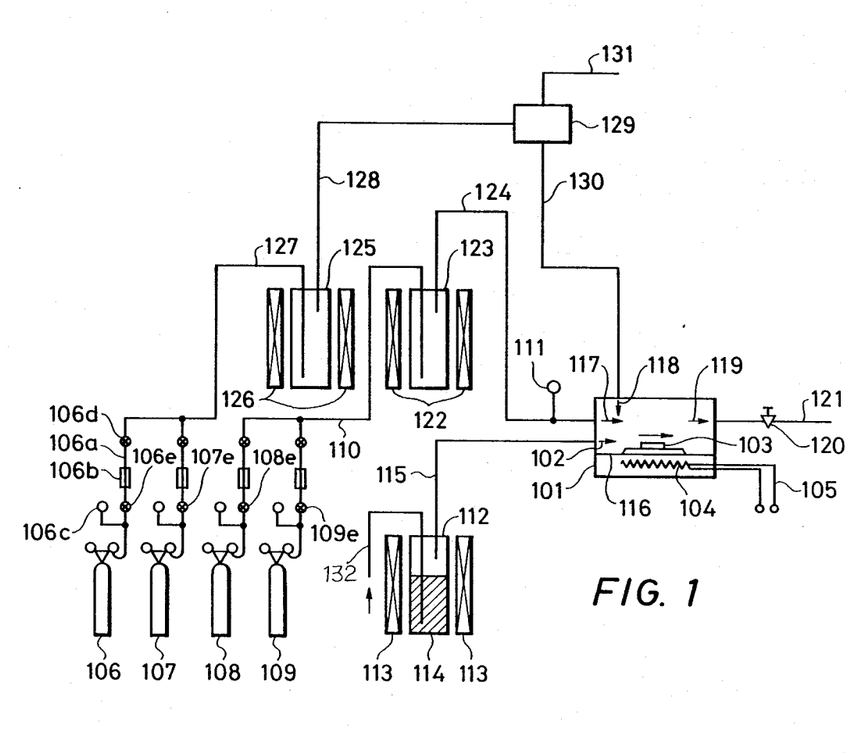
FIG. 1 illustrates schematically the constitution of an example of the devices for embodying the method of the present invention.

By use of the device shown in FIG. 1, a multilayer deposited film comprising i-type, p-type and n-type A-Si(H, X) and A-SiGe(H, X) was formed.

In FIG. 1, 101 is a deposition chamber in which a desired substrate 103 is placed on a substrate supporting stand 116 therein.

104 is a heater for heating substrate and supplied with electricity through the conductive wire 105 to generate heat. Said heater 104 is used for heating the substrate 103 before or during film formation treatment or for annealing treatment for further improvement of the characteristics of the film formed after film formation.

106 through 109 are gas feeding systems and provided corresponding to the number of the compounds such as germanium-containing halogen compounds, hydrogen, inert gas, hydrogenated silicon compound, carbon halide compounds, compounds containing impurity element as the component. Among these gases, when a liquid compound is used, a suitable gasifying device is provided.

In the Figure, the numerals of gas feeding systems 106 through 109 affixed with a denote branched pipes, those affixed with b flowmeters, those affixed with c pressure gauges for measuring the pressure on the higher pressure side of the respective flowmeters, and those affixed with d and e valves for controlling the respective gas flow rates. 123 is an activation chamber (C) for forming the active species (C) and a microwave plasma generating device 122 for generating activation energy for forming the active species (C) provided around the activation chamber 123. The starting material gas for formation of the active species (C) fed through the gas introducing pipe 110 is activated in the activation chamber (C) and the active species (C) formed is introduced through the introducing pipe 124 into the film forming chamber 101 as shown by the arrow 117. 111 is a gas pressure gauge.

In FIG. 1, 112 is an activation chamber (A), 113 an electric furnace, 114 solid Si particles, 132 an introducing pipe for the gaseous compound containing silicon and halogen for the starting material of the active species (A), and the active species (A) formed in the activation chamber (A) 112 is introduced into the film forming chamber 101 through the introducing pipe 115 as shown in the arrow 102.

In FIG. 1, 125 is an activation chamber (B), and around the activation chamber (B) 125 is provided a microwave plasma generating device 126 for generation of the activation energy for forming the active species (B). The object starting material gas (B) for formation of the active species (B) fed through the gas introducing pipe 127 is activated in the activation chamber (B), and the active species (B) formed is introduced into the gas distributor having three-way valve 129 through the introducing pipe 128. The gas distributor 129 is controlled by electrical signals to connect the introducing pipe 128 to either the introducing pipe 130 or the discharging pipe 131. When the introducing pipe 128 is made conductive to the introducing pipe 130, the active species (B) is introduced into the film forming chamber 101 as shown by the arrow 118. When the introducing pipe 128 is made conductive to the discharging pipe 131, the active species (B) is discharged out of the system by an evacuation device (not shown). Thus, only by switching of the three-way valve in the gas distributor 129, the amount of the gas flowing in the introducing pipe 128 is not changed and therefore a structure capable of controlling the flow of the gas at extremely stable flow rate can be given.

In the Figure, 120 is an evacuation valve and 121 an evacuation pipe.

First, Corning 7059 glass (trade name) substrate 103 was placed on the supporting stand 116, and the film forming chamber 101 was internally evacuated by means of an evacuation device to be reduced to a pressure of $10^{-6}$ Torr. After the substrate temperature was maintained at 200° C., H$_2$ gas from the gas feeding bomb 108 was fed at 150 SCCM, or a gas mixture thereof with PH$_3$ gas or B$_2$H$_6$ gas (each diluted to 1000 ppm with hydrogen gas) at 40 SCCM through the gas introducing pipe 110 into the activation chamber (C) 123. H$_2$gas, etc. introduced into the activation chamber (C) 123 is activated by the microwave plasma generating device 122 applied with microwave power of 300W to be made atomic hydrogen, BH$_g$, PH$_z$ (g=1 or w, z=1 or 2) active species, etc., and were introduced through the introducing pipe 124 into the film forming chamber 101.

On the other hand, the activation chamber (A) 112 was filled with solid Si particles 114, heated by the electric furnace 113 to be maintained at about 1100° C., thereby making Si red hot state, whereinto SiF$_4$ was blown at 100 SCCM through the introducing pipe 132 from the bomb not shown, to form SiF$_2$* as the active species (A), and the SiF$_2$* were introduced through introducing pipe 115 into the film forming chamber 101 as shown by the arrow 102.

Also, GeF$_4$ was introduced at 1 SCCM from the bomb 106 for gas feeding into the activation chamber (B) 125. GeF$_4$ introduced into the activation chamber (B) 125 is activated by the microwave plasma generating device 126 applied with microwave power of 150W to form activated species (B) such as GeF$_n$ (n=1, 2 or 3), etc. The activated species (B) formed were led through the gas introducing pipe 128 to the gas distributor 129 and introduced intermittently at 5 sec. intervals through the introducing pipe 130 into the film forming chamber 101.

The pressure in the film forming chamber 101 was maintained at 0.4 Torr, and this value was not substantially affected by introduction of the active species (B) or shut-down thereof. As a result, a film of non-doped or doped A-SiGe(H, X) (film thickness 700 Å) was formed. The film forming speed was 25 Å/sec.

Next, the non-doped or p-type A-SiGe(H,X) film sample was placed in a vapor deposition tank and a combshaped Al gap electrode (gap length 250 μ, width 5 mm) was formed under vacuum of $10^{-5}$ Torr, followed by determination of dark electroconductivity $\sigma d$ by measurement of dark current at applied voltage of 10V for evaluation of A-SiGe(H,X). The results are shown below.

---

Period of A—Si(H,X)/A—SiGe(H,X)  250 Å
Non-doped sample
  $\sigma d = 5 \times 10^{-12}$ S/cm
  $\sigma p = 6 \times 10^{-6}$ S/cm
   (when irradiated with light of 700 nm,
    0.3 mW/cm$^2$)
B-doped sample
  $\sigma d = 5 \times 10^{-7}$ S/cm
P-doped sample
  $\sigma d = 7 \times 10^{-6}$ S/cm

---

It can be seen that according to the present invention, A-SiGe(H,X) film excellent in electrical characteristics can be obtained, and A-SiGe(H,X) film sufficiently doped can be obtained.

EXAMPLE 2

By use of the same device shown in FIG. 1 as in Example 1, a drum-shaped image forming member for electrophotography having the layer constitution as shown in FIG. 2 was prepared.

Into the film forming chamber 101, an aluminum plate was placed as the substrate 103 and heated to 200° C. by the heater 104.

Also, the activation chamber (A) 112 was filled with solid Si particles 114 and heated by the electric furnace 113 to be maintained at about 1100° C., thereby making Si red hot state, whereinto SiF$_4$ was blown from the bomb not shown through the introducing pipe 132 to form SiF$_2$* as the activated species (A), and said SiF$_2$* was introduced at 150 SCCM through the introducing pipe 115 into the film forming chamber 101. GeF$_4$ filled in the bomb 106 was introduced at 1 SCCM through the gas introducing pipe 127 into the activation chamber (B) 125. By activation in the activation chamber (B) 125 by the microwave plasma generating device 126 of 2.45 GHz applied with a power of 150W, the active species (C) in the form of GeF$_n$ (n−1, 2 or 3) was formed. The active species (C) formed was led through the introducing pipe 128 to the gas distributor having a three-way valve 129 and introduced intermittently by opening and closing every 5 seconds into the film forming chamber 101.

Also, H$_2$ gas was introduced through the introducing pipe 110 into the activation chamber (C) 123. The H$_2$ gas introduced was subjected to activation treatment of plasma formation, etc. by the microwave plasma generating device 122 in the activation chamber (C) 123 to be converted to activated hydrogen, etc. and introduced through the introducing pipe 124 into the film forming chamber 101. During this operation, if necessary, impurity gas such as of PH$_3$, B$_2$H$_6$, etc. was also introduced into the activation chamber (C) to be activated. The inner pressure in the film forming space 101 was maintained at 1.0 Torr.

The waste gas is discharged through the evacuation valve 120. Thus, a multi-layer photosensitive layer 13 comprising A-Si and A-SiGe is formed.

On the other hand, the intermediate layer 12 was formed prior to formation of the photosensitive layer by introducing a gas mixture of H$_2$ and B$_2$H$_6$ (0.2% of B$_2$H$_6$ gas in vol. %) through the introducing pipe 110, with other conditions being the same as in formation of the photosensitive layer 13, to a film thickness of 2000 Å.

The preparation conditions and the performance of the drum-shaped image forming member for electrophotography are shown below.

---

| | |
|---|---|
| Starting material gas for formation of active species (A) SiF$_4$ | 150 SCCM |
| Starting material gas for formation of active species (B) GeF$_4$ | 1.5 SCCM |
| Starting material gas for formation of active species (C) H$_2$ | 100 SCCM |
| Inner pressure in film forming chamber | 1.0 Torr |
| Film forming speed | 15 Å/s |
| Layer thickness of photosensitive layer 13 | 21μ |
| Acceptance potential by + corona charging | 290 V |
| Potential after irradiation of light of 700 nm, 0.3 mW/cm$^2$ for 0.2 sec. | 0 V |

---

EXAMPLE 3

By use of the same device shown in FIG. 1 as in Example 1, a PIN type diode as shown in FIG. 3 was prepared.

First, a glass substrate 21 having an ITO film 22 of 1000 Å vapor deposited thereon was placed on a supporting stand and, after evacuation to $10^{-6}$ Torr, similarly as in Example 1, the active species of SiF$_2$ formed by thermal reaction of SiF$_4$ at 150 SCCM from the introducing pipe 115 with Si particles was introduced through the introducing pipe 115, and from the introducing pipe 110, H$_2$ at 150 SCCM and B$_2$H$_6$ gas (diluted to 1000 ppm with hydrogen gas) were respectively introduced into the activation chamber (C) 123, followed by activation by microwave plasma.

At the same time, C$_2$F$_6$ gas filled in the bomb was flowed through the introducing pipe 127 into the activation camber (B) 125 and activated by microwave plasma to form the active species (B). By control of the gas distributor having three-way valve 129. The active species (c) of the fluorinated carbon was introduced at intervals of 10 sec. into the film forming chamber 101.

Subsequently, the activated gas was introduced through the introducing pipe 116 and under the pressure in the film forming chamber maintained at 0.4 Torr, a multi-layer film 24 (film thickness 200 Å) comprising A-Si(H,X) and A-SiC(H,X) doped with B was formed.

Next, the activated species (A) was formed in the same manner as described above, GeH$_4$ gas was introduced as the active species (B) at intervals of 5 sec. and the active species (C) was formed without containing B$_2$H$_6$ at all, and then the respective species (A), (B) and (C) were introduced into the film forming space to form a multi-layer film 25 (film thickness 5000 Å) of i-type A-Si(H,X) and A-SiGe(H,X).

Next, under the same conditions for the i-type except for using H$_2$gas containing PH$_3$ gas (diluted to 1000 ppm with hydrogen gas) and stopping introduction of GeF$_4$, a n-type A-SiGe(H,X) film 26 doped with P (film thickness 300 Å) was formed. Further, on the n-type film, an aluminum electrode 27 with a film thickness of 500 Å was formed by vacuum vapor deposition to obtain a PIN type diode.

The I-V characteristics of the diode device thus obtained (area 1 cm$^2$) were measured for evaluation of rectifying characteristics and photovoltaic effect. The rectifying ratio of diode of $3 \times 10^2$ and n value diode of 1.2 were obtained.

As for light irradiation characteristic, by introducing light from the substrate side with a light irradiation intensity AMI of about 100 mW/cm$^2$, conversion efficiency of 8.2% or higher, open circuit voltage of 0.8V and short circuit current of 14 mA/cm$^2$ were obtained.

As described in detail above, according to the method for forming multi-layer deposited film of the present invention, desired electrical, optical, photoconductive and mechanical characteristics are improved in the film formed, and also high speed film formation is rendered possible. Also reproducibility in film formation is improved to improve the film quality and uniformize film quality, and also the method is advantageous in enlargement of area of the film to improve productivity of the film and also accomplish easily bulk production. Further, since no excitation energy is used during film formation, film formation is possible also on a substrate having poor heat resistance. By low temperature treatment, such an effect as shortening of the steps is exhibited.

We claim:

1. A method for forming a multi-layer deposited film on a substrate in a film forming space, comprising:

separately introducing into the film forming space (i) an active species (A) at a first flow rate (a) said active species (A) formed by decomposition of a starting material gas (A) which is a major flow rate component, said starting material gas (A) being a compound containing silicon and halogen, (ii) an active species (B) at a second flow rate (b), said active species (B) formed by decomposition of a starting material gas (B) which is a minor flow rate component, said starting material gas (B) being a compound containing germanium or carbon and halogen, and (iii) an active species (C) at a third flow rate (c), said active species (C) being reactive with said active species (A) and said active species (B) and formed from a compound (C), compound (C) being a hydrogenated silicon compound;

forming a first deposited film layer on the substrate by permitting said active species (A) and active species (B) to form a mixture, and allowing said mixture to chemically react with said active species (C) to thereby produce the first deposited film layer on the substrate having a first composition; and forming at least a second deposited film layer on top of said first deposited film layer by varying said second flow rate (b) relative to said first flow rate (a) to thereby produce said at least second deposited film layer having a second composition different from said first composition;

wherein the said first flow rate (a), said second flow rate (b) and said third flow rate (c) are maintained such that $((a)+(b)/(c))$ is within a range of between 10/1 and 1/10 and wherein said first deposited film layer and said at least second deposited film layer each have a thickness of between 10 Å and 200 Å.

2. The method according to claim 1, wherein each layer of the multi-layer structure film has a film thickness in the range of from 10 Å to 200 Å.

3. The method according to claim 1, wherein relative to the amount (a) of the starting material gas (A) as introduced, the amount (b) of the starting material gas (B) as introduced is made ½ or less.

4. The method according to claim 1, wherein a silicon compound is used as the starting material gas (A).

5. The method according to claim 1, wherein a germanium compound is used as the starting material gas (B).

6. The method according to claim 1, wherein a carbon compound is used as the starting material gas (B).

* * * * *

UNITED STATES PATENT AND TRADEMARK OFFICE
CERTIFICATE OF CORRECTION

PATENT NO. : 4,824,697
DATED : April 25, 1989
INVENTOR(S) : SHUNICHI ISHIHARA, ET AL.

It is certified that error appears in the above-identified patent and that said Letters Patent is hereby corrected as shown below:

COLUMN 5

Line 1, "$Si_2SiH_5Si_2H_5$" should read
--$Si_2H_5SiH(SiH_3)Si_2H_5$--.

COLUMN 7

Line 7, "1 to 5X10 atomic ppm." should read
--1 to $5X10^3$ atomic ppm.--.

Signed and Sealed this

Seventh Day of August, 1990

Attest:

HARRY F. MANBECK, JR.

Attesting Officer

Commissioner of Patents and Trademarks